United States Patent
Kim et al.

(10) Patent No.: US 10,134,667 B2
(45) Date of Patent: Nov. 20, 2018

(54) CHIP-ON-FILM SEMICONDUCTOR PACKAGES AND DISPLAY APPARATUS INCLUDING THE SAME

(71) Applicant: SAMSUNG ELECTRONICS CO., LTD., Suwon-si (KR)

(72) Inventors: Jung-woo Kim, Osan-si (KR); Jae-min Jung, Seoul (KR); Ji-yong Park, Hwaseong-si (KR); Jeong-kyu Ha, Hwaseong-si (KR); Woon-bae Kim, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/964,342

(22) Filed: Apr. 27, 2018

(65) Prior Publication Data

US 2018/0247882 A1 Aug. 30, 2018

Related U.S. Application Data

(63) Continuation of application No. 15/479,856, filed on Apr. 5, 2017, now Pat. No. 9,978,674.

(30) Foreign Application Priority Data

Sep. 5, 2016 (KR) .......................... 10-2016-0113982

(51) Int. Cl.
*H01L 33/48* (2010.01)
*H01L 23/498* (2006.01)
(Continued)

(52) U.S. Cl.
CPC .......... *H01L 23/4985* (2013.01); *H01L 23/29* (2013.01); *H01L 24/32* (2013.01);
(Continued)

(58) Field of Classification Search
CPC ......... H01L 33/48; H01L 33/62; H01L 23/32; H01L 23/488; H01L 23/4922; H01L 24/29; H01L 25/167
(Continued)

(56) References Cited

U.S. PATENT DOCUMENTS

| 5,317,438 A | 5/1994 | Suzuki et al. |
| 7,714,973 B2 | 5/2010 | Nakanishi |

(Continued)

FOREIGN PATENT DOCUMENTS

| JP | 2007-25361 A | 2/2007 |
| JP | 2008-225401 A | 9/2008 |

(Continued)

*Primary Examiner* — George Fourson, III
(74) *Attorney, Agent, or Firm* — Sughrue Mion, PLLC

(57) ABSTRACT

Provided are a chip-on-film (COF) semiconductor package capable of improving connection characteristics and a display apparatus including the package. The COF semiconductor package includes a film substrate, a conductive interconnection located on at least one surface of the film substrate and an output pin connected to the conductive interconnection and located at one edge on a first surface of the film substrate, a semiconductor chip connected to the conductive interconnection and mounted on the first surface of the film substrate, a solder resist layer on the first surface of the film substrate to cover at least a portion of the conductive interconnection, and at least one barrier dam on the solder resist layer between the semiconductor chip and the output pin.

20 Claims, 13 Drawing Sheets

Related U.S. Application Data

(60) Provisional application No. 62/318,341, filed on Apr. 5, 2016.

(51) Int. Cl.
    *H01L 23/29*     (2006.01)
    *H01L 23/00*     (2006.01)
    *H01L 23/488*     (2006.01)
    *H01L 33/62*     (2010.01)
    *H01L 23/492*     (2006.01)
    *H01L 25/16*     (2006.01)

(52) U.S. Cl.
    CPC ........ *H01L 23/488* (2013.01); *H01L 23/4922* (2013.01); *H01L 24/29* (2013.01); *H01L 25/167* (2013.01); *H01L 33/48* (2013.01); *H01L 33/62* (2013.01); *H01L 2924/143* (2013.01); *H01L 2924/186* (2013.01)

(58) Field of Classification Search
    USPC .......................................................... 257/99
    See application file for complete search history.

(56) References Cited

U.S. PATENT DOCUMENTS

| | | |
|---|---|---|
| 8,174,822 B2 | 5/2012 | Kim et al. |
| 9,229,566 B2 | 1/2016 | Kang |
| 2006/0226203 A1* | 10/2006 | Lu ........................ B23K 1/0016 228/219 |
| 2010/0084963 A1 | 4/2010 | Lifka |
| 2012/0092817 A1 | 4/2012 | Shibahara et al. |
| 2012/0164791 A1 | 6/2012 | Kim |
| 2013/0087822 A1 | 4/2013 | Kim |
| 2013/0109136 A1 | 5/2013 | Foote |
| 2014/0118969 A1 | 5/2014 | Lee |
| 2015/0028307 A1 | 1/2015 | Kim |
| 2015/0069345 A1 | 3/2015 | Beom et al. |
| 2015/0250051 A1* | 9/2015 | Yumoto ............... H05K 3/3484 174/258 |
| 2016/0007478 A1 | 1/2016 | Lai et al. |
| 2016/0154261 A1 | 6/2016 | Kim |
| 2016/0233199 A1* | 8/2016 | Cho .................. H01L 25/0753 |
| 2016/0276293 A1* | 9/2016 | Hung ................. H01L 27/0248 |
| 2017/0236984 A1* | 8/2017 | Heo ..................... H01L 33/507 257/98 |
| 2017/0338108 A1 | 11/2017 | Yamazaki |

FOREIGN PATENT DOCUMENTS

| | | |
|---|---|---|
| JP | 4252568 B2 | 4/2009 |
| KR | 10-2014-0050480 A | 4/2014 |
| KR | 10-2014-0052708 A | 5/2014 |
| KR | 10-2015-0030325 A | 3/2015 |

\* cited by examiner

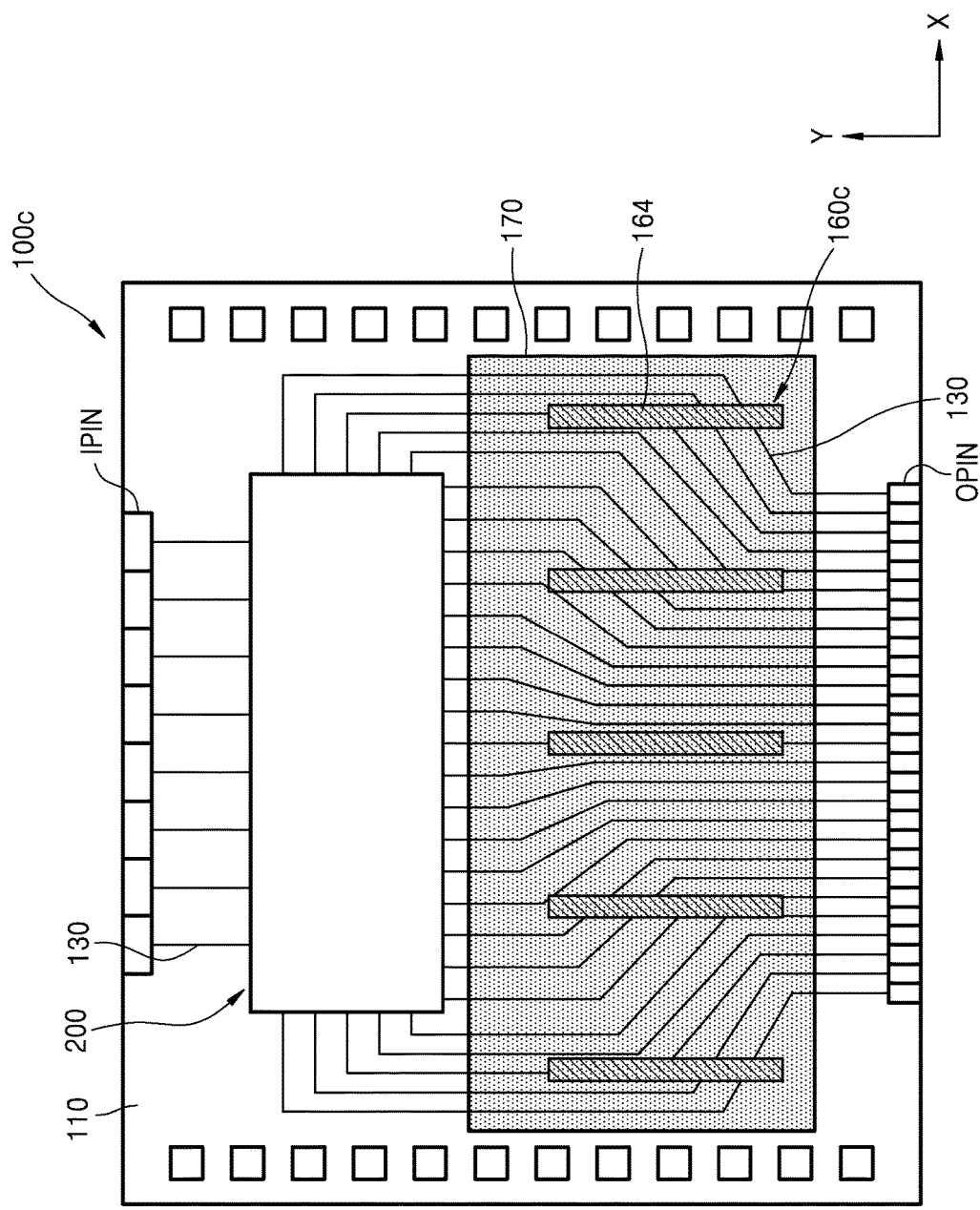

CHIP-ON-FILM SEMICONDUCTOR PACKAGES AND DISPLAY APPARATUS INCLUDING THE SAME

CROSS-REFERENCE TO RELATED APPLICATIONS

This application is a continuation application of U.S. patent application Ser. No. 15/479,856, filed on Apr. 5, 2017, which claims the benefit of U.S. Provisional Application No. 62/318,341, filed on Apr. 5, 2016, in the U.S. Patent and Trademark Office and Korean Patent Application No. 10-2016-0113982, filed on Sep. 5, 2016, in the Korean Intellectual Property Office, the disclosures of which are incorporated herein in their entireties by reference.

BACKGROUND

The inventive concept relates to a semiconductor package and a display apparatus including the same, and more particularly, to a chip-on-film (COF) semiconductor package and a display apparatus including the same.

A COF semiconductor package may include a semiconductor chip mounted on a film substrate by using a flip-chip technique. The COF semiconductor package may be connected to an external circuit through input/output (I/O) pins connected to a metal pattern on the film substrate.

As electronic products are being made more downscaled, ultrathin, lightweight, and highly efficient, it is more necessary to improve connection characteristics of an electronic device connected to a COF semiconductor package.

SUMMARY

The inventive concept provides a chip-on-film (COF) semiconductor package capable of improving connection characteristics and a display apparatus including the COF semiconductor package.

According to an aspect of the inventive concept, there is provided a COF semiconductor package. The COF semiconductor package includes a film substrate, a conductive interconnection located on at least one surface of the film substrate and an output pin connected to the conductive interconnection and located at one edge on a first surface of the film substrate, a semiconductor chip connected to the conductive interconnection and mounted on the first surface of the film substrate, a solder resist layer on the first surface of the film substrate to cover at least a portion of the conductive interconnection, and a barrier dam on the solder resist layer between the semiconductor chip and the output pin.

According to another aspect of the inventive concept, there is provided a display apparatus. The display apparatus includes a COF semiconductor package having a film substrate, an image display panel having a transparent substrate, the image display panel on which a portion of a first surface of the film substrate and a portion of a second surface of the transparent substrate are spaced apart opposite to each other by a gap, and an anisotropic conductive layer between the film substrate and the transparent substrate and configured to electrically connect the COF semiconductor package with the image display panel. The COF semiconductor package includes the film substrate, a display driver integrated circuit (IC) adhered to the first surface of the film substrate, at least one barrier dam located on the first surface of the film substrate, and a first hydrophobic coating layer located on at least a portion of the first surface of the film substrate to cover the at least one barrier dam.

In yet another aspect of the inventive concept, there is a display apparatus including: a chip-on-film semiconductor package including a film substrate, the film substrate including a first surface; a display driver integrated circuit (IC) disposed on the first surface of the film substrate; a barrier dam disposed on the first surface of the film substrate; and a first hydrophobic coating layer located on at least a portion of the first surface of the film substrate, the first hydrophobic coating layer covering the barrier dam. Further, there is an image display panel including a transparent substrate, a portion of a surface of the transparent substrate and a portion of the first surface of the film substrate being spaced apart by a gap; and an anisotropic conductive layer disposed between the film substrate and the transparent substrate and electrically connecting the chip-on-film semiconductor package with the image display panel.

In another aspect of the inventive concept, there is a semiconductor apparatus including: a chip-on-film semiconductor package including a flexible substrate, the flexible substrate including a first surface; an integrated circuit (IC) disposed on the first surface of the flexible substrate; a dam disposed on the first surface of the flexible substrate; and a first hydrophobic layer located on at least a portion of the first surface of the flexible substrate, the first hydrophobic coating layer covering the dam. Further, there is a planar semiconductor device including: a planar substrate; and a second hydrophobic layer disposed on a portion of the planar substrate. Furthermore, there is an anisotropic conductive layer disposed between the chip-on-film semiconductor package and the planar semiconductor device, and disposed to one side of the first and the second hydrophobic layers, the anisotropic conductive layer electrically connecting the chip-on-film semiconductor package and the planar semiconductor device, wherein the first and the second hydrophobic layers are spaced apart by a gap, the gap being of a distance which prevents a liquid from entering into the gap and be in contact with the anisotropic conductive layer.

BRIEF DESCRIPTION OF THE DRAWINGS

Exemplary embodiments will be more clearly understood from the following detailed description taken in conjunction with the accompanying drawings in which:

FIGS. 5A and 5B are respectively a schematic diagram and a cross-sectional view of a COF semiconductor package according to an exemplary embodiment;

DETAILED DESCRIPTION OF THE EXEMPLARY EMBODIMENTS

As used herein, the term "and/or" includes any and all combinations of one or more of the associated listed items. Expressions such as "at least one of," when preceding a list of elements, modify the entire list of elements and do not modify the individual elements of the list. Unless specified, expressions such as "substantially" include variances due to manufacturing or processing tolerances.

Various exemplary embodiments will now be described more fully with reference to the accompanying drawings in which some exemplary embodiments are shown.

Figure 1A:
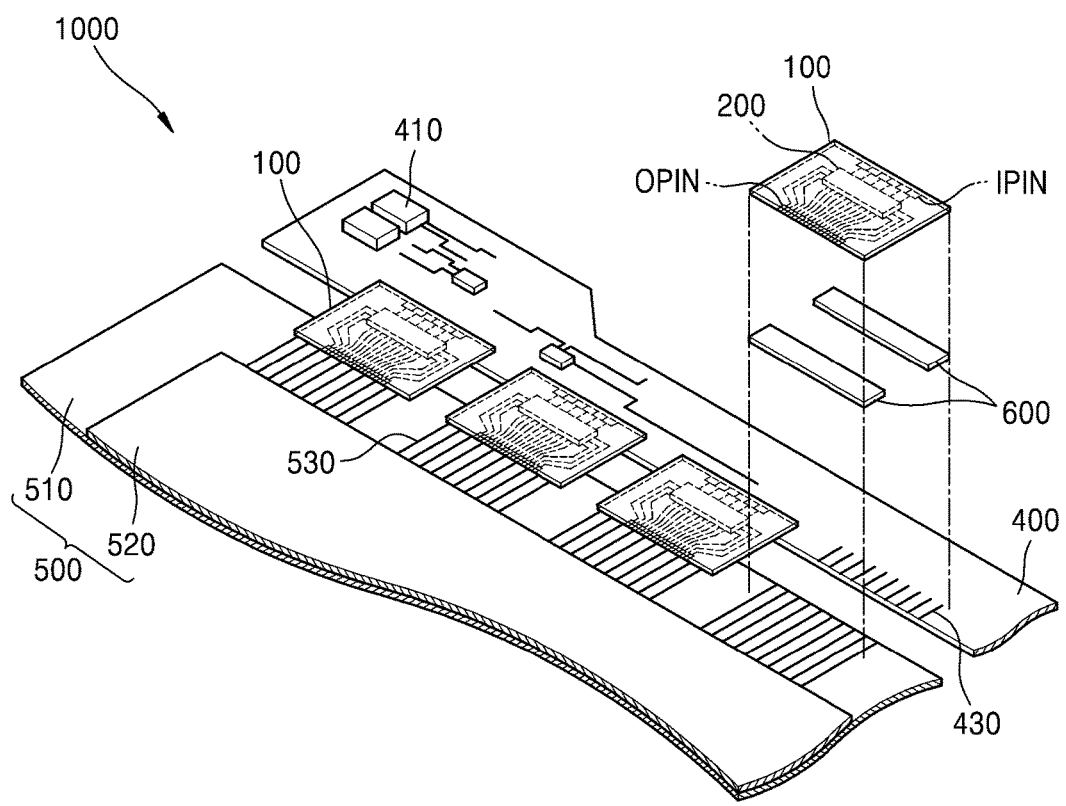
FIGS. 1A and 1B are respectively a perspective view and a block diagram of a display apparatus including a chip-on-film (COF) semiconductor package according to an exemplary embodiment.
Figure 1B:
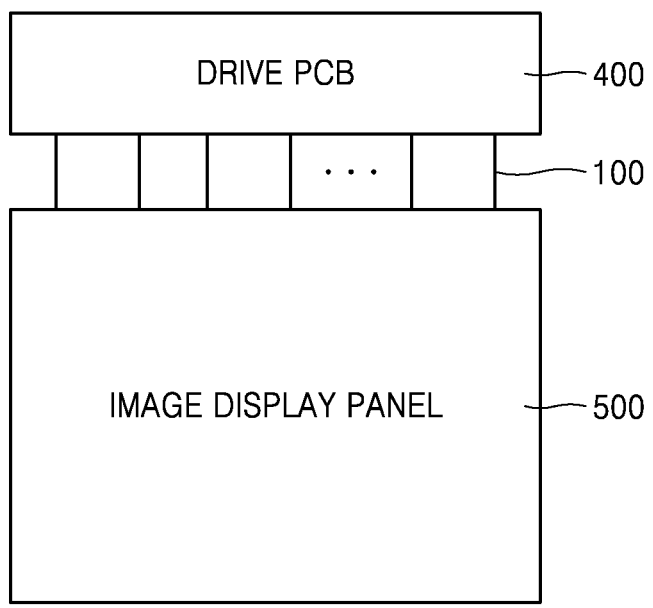

FIGS. 1A and 1B are respectively a perspective view and a block diagram of a display apparatus 1000 including a chip-on-film (COF) semiconductor package according to an exemplary embodiment.

Referring to FIGS. 1A and 1B, the display apparatus 1000 may include at least one COF semiconductor package 100, a driver printed circuit board (PCB) 400, and a planar semiconductor device, e.g., an image display panel 500. The COF semiconductor package 100 may be connected between the driver PCB 400 and the image display panel 500. The COF semiconductor package 100 may receive a signal output by the driver PCB 400 and transmit the signal to the image display panel 500.

The COF semiconductor package 100 may be a display driver IC (DDI) package including a semiconductor chip 200, which is a DDI. At least one driver circuit chip 410 capable of simultaneously applying power and signals to the COF semiconductor package 100 may be mounted on the driver PCB 400.

The image display panel 500 may be, for example, a liquid crystal display (LCD) panel, a light emitting diode (LED) panel, an organic LED (OLED) panel, or a plasma display panel (PDP).

The COF semiconductor package 100 may be connected to each of a drive connection interconnection 430 of the driver PCB 400 and a panel connection interconnection 530 of the image display panel 500.

In some exemplary embodiments, at least one COF semiconductor package 100 may be connected between the driver PCB 400 and the image display panel 500. For example, when the image display panel 500 provides a small-area screen, such as a screen of a portable phone, or supports low resolution, the display apparatus 1000 may include one COF semiconductor package 100.

In some exemplary embodiments, a plurality of COF semiconductor packages 100 may be connected between the driver PCB 400 and the image display panel 500. For example, when the image display panel 500 provides a large-area screen, such as a screen of a television, or supports high resolution, the display apparatus 1000 may include a plurality of COF semiconductor packages 100.

The COF semiconductor package 100 may be connected to one side of the image display panel 500, but the inventive concept is not limited thereto. In some exemplary embodiments, at least one COF semiconductor package 100 may be connected to each of at least two sides of the image display panel 500. For example, when at least one COF semiconductor package 100 is connected to each of two sides of the image display panel 500, which are connected to each other, the COF semiconductor package 100 connected to one side of the image display panel 500 may be connected to gate lines of the image display panel 500 and serve as a gate driver, while the COF semiconductor package 100 connected to another side connected to the one side of the image display panel 500 may be connected to source lines of the image display panel 500 and serve as a source driver.

The image display panel 500 may include a planar substrate, e.g., transparent substrate 510, and an image region 520 and a plurality of panel connection interconnections 530 formed on the transparent substrate 510. The transparent substrate 510 may be, for example, a glass substrate or a transparent flexible substrate. A plurality of pixels included in the image region 520 may be connected to the plurality of panel connection interconnections 530 and operate in response to signals provided by the semiconductor chip 200 included in the COF semiconductor package 100.

An input pin IPIN may be formed at one edge of the COF semiconductor package 100, while an output pin OPIN may be formed at another edge thereof. The input pin IPIN and the output pin OPIN may be respectively connected to the drive connection interconnection 430 of the driver PCB 400 and the panel connection interconnections 530 of the image display panel 500 by an anisotropic conductive layer 600. The anisotropic conductive layer 600 may be, for example, an anisotropic conductive film or anisotropic conductive paste. The anisotropic conductive layer 600 may have a structure in which conductive particles are dispersed in an insulating adhesive layer. When one electrode is connected to the other electrode through anisotropic conductive layer 600, the anisotropic conductive layer 600 may have anisotropic electrical properties so that an electrical conduction path may be formed in a direction of electrodes (i.e., substantially a perpendicular direction), while insulation may be provided in a direction of a space between the electrodes (i.e., a horizontal direction). When the insulating adhesive layer is melted by applying heat and pressure, the conductive particles may be arranged between opposite electrodes (e.g., between the input pin IPIN and the drive connection interconnection 430 or between the output pin OPIN and the panel connection interconnection 530) to provide conductivity thereinbetween, while the insulating adhesive layer may be filled between adjacent electrodes to insulate the adjacent electrodes from each other.

Figure 2A:
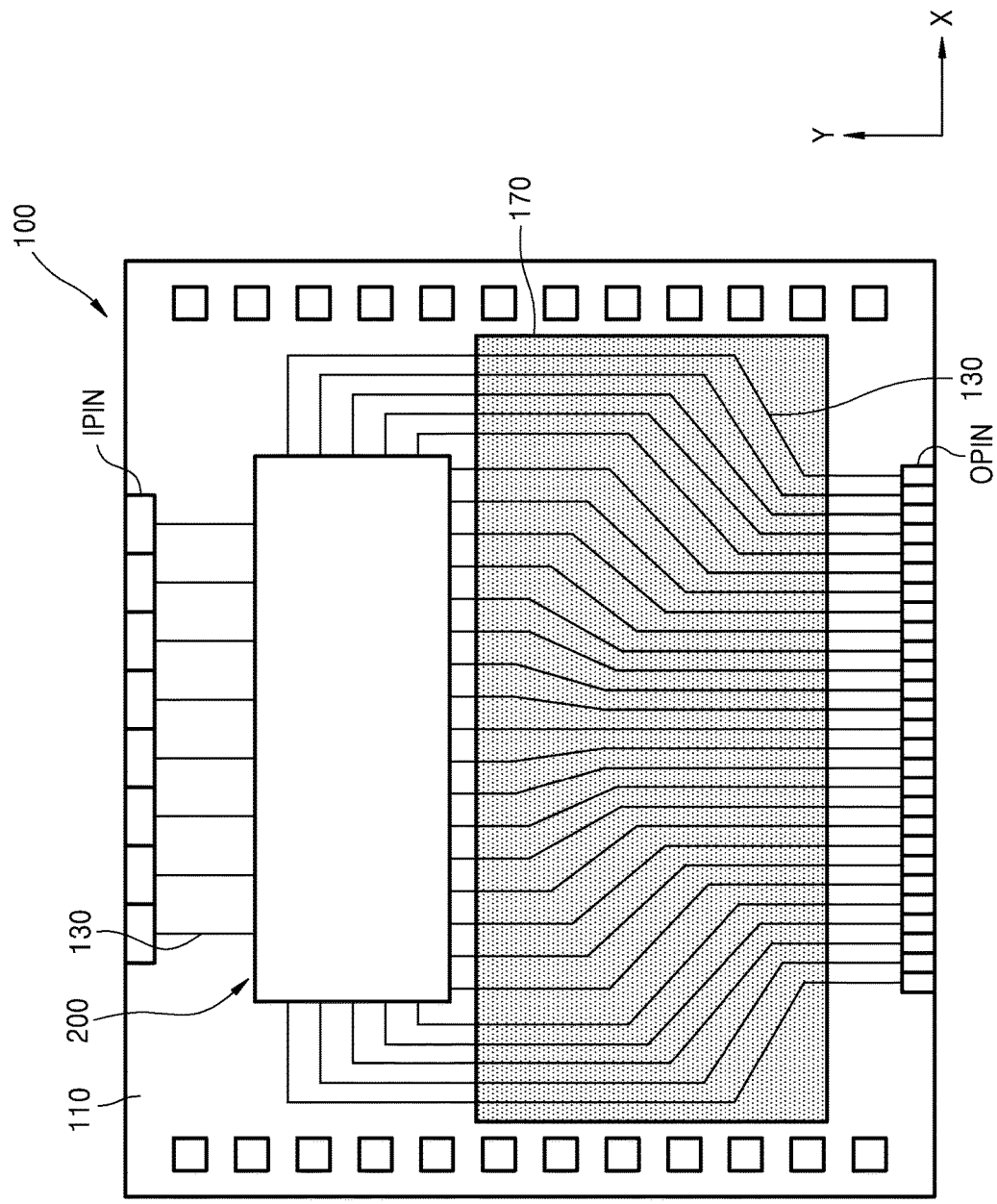
FIGS. 2A and 2B are respectively a schematic diagram and a cross-sectional view of a COF semiconductor package according to an exemplary embodiment.
Figure 2B:
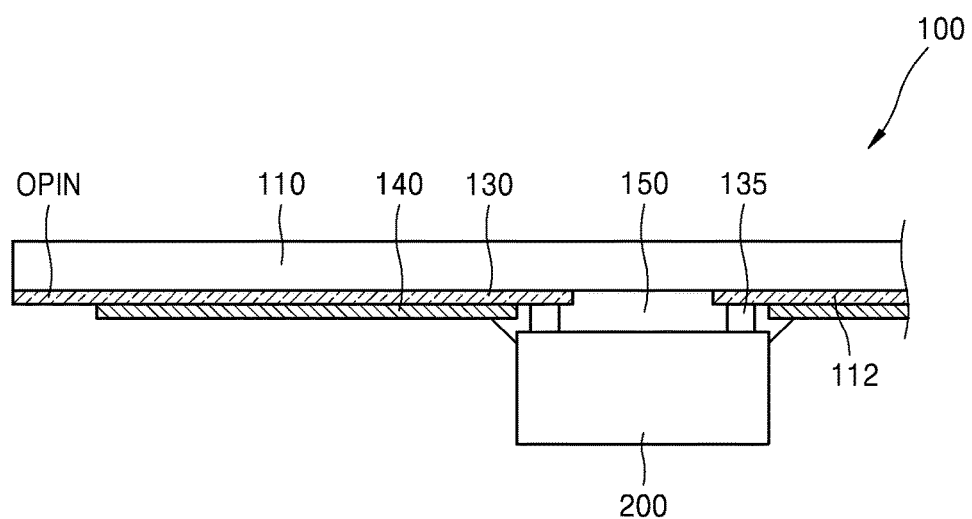

FIGS. 2A and 2B are respectively a schematic diagram and a cross-sectional view of a COF semiconductor package 100 according to an exemplary embodiment.

Referring to FIGS. 2A and 2B, the COF semiconductor package 100 may include a film substrate 110, e.g., a flexible substrate, a conductive interconnection 130, and a semiconductor chip 200 adhered to a first surface 112 of the film substrate 110. An output pin OPIN and an input pin IPIN, each of which is connected to the conductive interconnection 130, may be respectively formed at one edge and another edge of the film substrate 110 or portions adjacent to the two edges of the film substrate 110. The output pin OPIN may be formed on the first surface 112 of the film substrate 110.

The film substrate 110 may include an insulating material. The film substrate 110 may be, for example, a resin-based material including polyimide, polyester, or another known material, and have flexibility. The conductive interconnection 130 may include, for example, aluminum foil or copper foil. In some exemplary embodiments, the conductive interconnection 130 may be formed by patterning a metal layer that is formed on the film substrate 110 by using a casting method, a laminating method, or an electroplating method. The conductive interconnection 130 may be formed on only one surface of the film substrate 110 or two surfaces of the film substrate 110. In some exemplary embodiments, when the conductive interconnections 130 are formed on both surfaces of the film substrate 110, the conductive interconnections 130 may be electrically connected to each other by a conductive via formed through the film substrate 110.

The input pin IPIN and the output pin OPIN may be portions of the conductive interconnection 130 or portions of the conductive interconnection 130, which are plated with tin (Sb), gold (Au), nickel (Ni), or lead (Pb). In some exemplary embodiments, the input pin IPIN and the output pin OPIN may be electrically connected to the conductive interconnection 130 and include an additional conductive material.

The semiconductor chip 200 may be mounted on the first surface 112 of the film substrate 110. The semiconductor chip 200 may be mounted by using a flip-chip technique on the film substrate 110 such that an active surface of the semiconductor chip 200 faces the film substrate 110. The semiconductor chip 200 may be connected to the conductive interconnection 130 by using a connection terminal 135. The conductive interconnection 130 may connect the input pin IPIN with the semiconductor chip 200 and connect the semiconductor chip 200 with the output pin OPIN.

An under-fill layer 150 may be formed between the semiconductor chip 200 and the film substrate 110 and surround the connection terminal 135. For example, the under-fill layer 150 may be formed by using a capillary under-fill method. The under-fill layer 150 may include, for example, an epoxy resin.

A hydrophobic coating layer 170 may be formed on a portion of a surface of the film substrate 110, which is adjacent to the output pin OPIN. The hydrophobic coating layer 170 may be formed on a portion of one surface of the film substrate 110, which faces the image display panel (refer to 500 in FIG. 1A).

In some exemplary embodiments, the hydrophobic coating layer 170 may include fluoropolymer silage, fluorinated acrylate, or fluorinated acrylate hybrid. In some exemplary embodiments, the hydrophobic coating layer 170 may include a polysiloxane-based resin. The polysiloxane-based resin may include a siloxane resin, an alkyl silicate, or a combination thereof. The alkyl silicate may include at least one C1-C8 alkyl group. Alternately, the alkyl silicate may include at least one of methyl silicate, ethyl silicate, propyl silicate, isopropyl silicate, butyl silicate, and/or isobutyl silicate. In some exemplary embodiments, the hydrophobic coating layer 170 may include at least one of silicone resin, epoxy resin, styrene resin, phenol resin, and/or urethane resin.

In some exemplary embodiments, the hydrophobic coating layer 170 may be formed to a thickness of about 1 μm.

The hydrophobic coating layer 170 may be formed not to cover the input pin IPIN and the output pin OPIN. In some exemplary embodiments, the hydrophobic coating layer 170 may cover a portion of a surface of the film substrate 110 between the output pin OPIN and the semiconductor chip 200, but the inventive concept is not limited thereto. In some exemplary embodiments, the hydrophobic coating layer 170 may cover a portion of a surface of the film substrate 110 between the output pin OPIN and the input pin IPIN and also cover a top surface and/or side surfaces of the semiconductor chip 200.

The hydrophobic coating layer 170 may be formed by using a stencil method, a dipping method, or a spray method.

The portion of the surface of the film substrate 110 on which the hydrophobic coating layer 170 is formed may have reduced wettability. Accordingly, permeation of a liquid, e.g., water or a liquid detergent, may be prevented during a cleaning process. Specifically, since the hydrophobic coating layer 170 is formed on the portion of the surface of the film substrate 110, which faces the image display panel (refer to 500 in FIG. 1A), the hydrophobic coating layer 170 may have waterproof or water-resistance characteristics so that water or a liquid detergent may be prevented from permeating to, flowing to, or permeating within the anisotropic conductive layer (refer to 600 in FIG. 1A) located between the image display panel 500 and the film substrate 110. Accordingly, by preventing water or the liquid detergent from permeating to, flowing to, or permeating within the anisotropic conductive layer 600, a short circuit or circuit burn may be prevented between the output pin OPIN of the COF semiconductor package 100 and the panel connection interconnection 530 of the image display panel 500.

In some exemplary embodiments, the hydrophobic coating layer 170 may not be provided when the COF semiconductor package 100 is formed alone, but formed during a process of manufacturing a display apparatus that will be described below.

A solder resist layer 140 may be formed on the first surface 112 of the film substrate 110. The solder resist layer 140 may completely or partially cover the conductive interconnection 130. For example, the solder resist layer 140 may be formed to expose portions of the conductive interconnection 130, which are connected to the output pin OPIN and the connection terminal 135. Alternatively, the solder resist layer 140 may be formed to expose a connection pad connected to the conductive interconnection 130.

In some exemplary embodiments, the formation of the solder resist layer 140 may include, for example, coating the film substrate 110 with solder mask insulating ink by using a screen printing method or an inkjet printing method and curing the solder mask insulating ink by using heat, ultraviolet (UV) light, or infrared (IR) light. In some exemplary embodiments, the formation of the solder resist layer 140 may include completely coating the film substrate 110 with photo-imageable solder resist by using a screen printing method or a spray coating method or adhering a film-type solder resist material to the film substrate 110 by using a laminating method, removing unnecessary portions by using exposing and developing methods, and curing the photo-imageable solder resist by using heat, UV light, or IR light.

Figure 3:
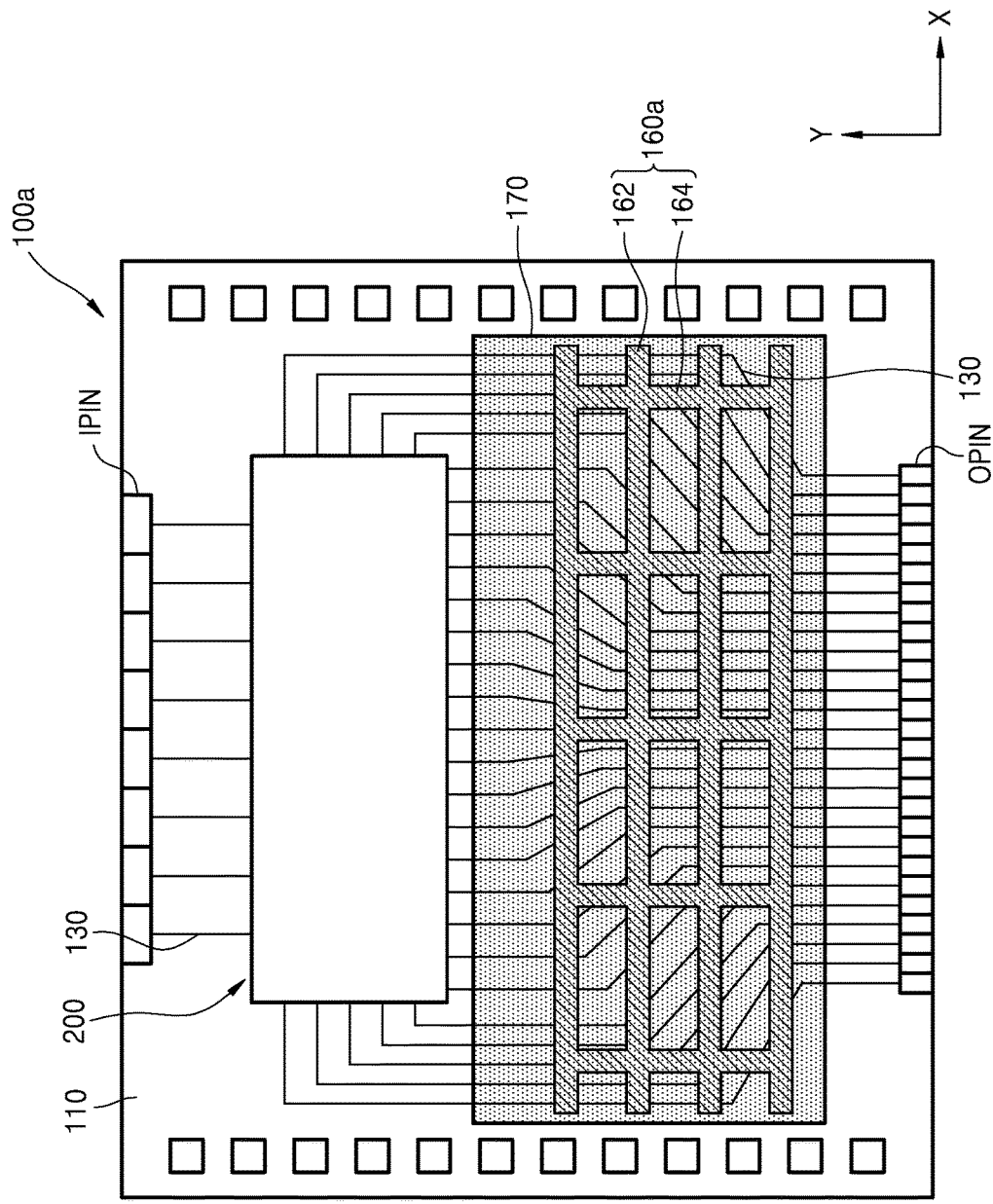
FIG. 3 is a schematic diagram of a COF semiconductor package according to an exemplary embodiment.

FIG. 3 is a schematic diagram of a COF semiconductor package 100a according to an exemplary embodiment. In FIG. 3, the same descriptions as in FIGS. 1A to 2B will be omitted.

Referring to FIG. 3, the COF semiconductor package 100a may include a film substrate 110, a conductive interconnection 130, and a semiconductor chip 200. In some exemplary embodiments, the COF semiconductor package 100a may further include a hydrophobic coating layer 170.

The COF semiconductor package 100a may further include a barrier dam 160a. In some exemplary embodiments, the barrier dam 160a may include a solder resist material. The barrier dam 160a may be located between the film substrate 110 and the hydrophobic coating layer 170. That is, the hydrophobic coating layer 170 may cover the barrier dam 160a formed on the film substrate 110. The barrier dam 160a may be formed on the film substrate 110 and located between the semiconductor chip 200 and the output pin OPIN.

The barrier dam 160a may include a plurality of first barrier dams 162 and a plurality of second barrier dams 164. The plurality of first barrier dams 162 may be spaced apart from one another and extend in a first direction X. For example, the plurality of first barrier dams 162 may be spaced apart from one another and extend from one side to another side of the film substrate 110. Here, a side of the film substrate 110 refers to one of two sides of the film substrate 110 in the first direction X.

The plurality of second barrier dams 164 may be spaced apart from one another and extend in a second direction Y that is different from the first direction X. For example, the second barrier dams 162 may extend from one edge to another edge of the film substrate 110. Here, an edge of the film substrate 110 refers to one of two edges of the film substrate 110 in the second direction Y.

In some exemplary embodiments, the plurality of first barrier dams 162 and the plurality of second barrier dams 164 may extend in a direction substantially perpendicular to each other (e.g, ±10° from 90°). The plurality of first barrier dams 162 may intersect the plurality of second barrier dams 164 form a mesh shape. Each of the first barrier dams 162 and the second barrier dams 164 may have a thickness of about several μm. The first barrier dams 162 and the second barrier dams 164 may substantially have the same thickness.

Figure 4A:
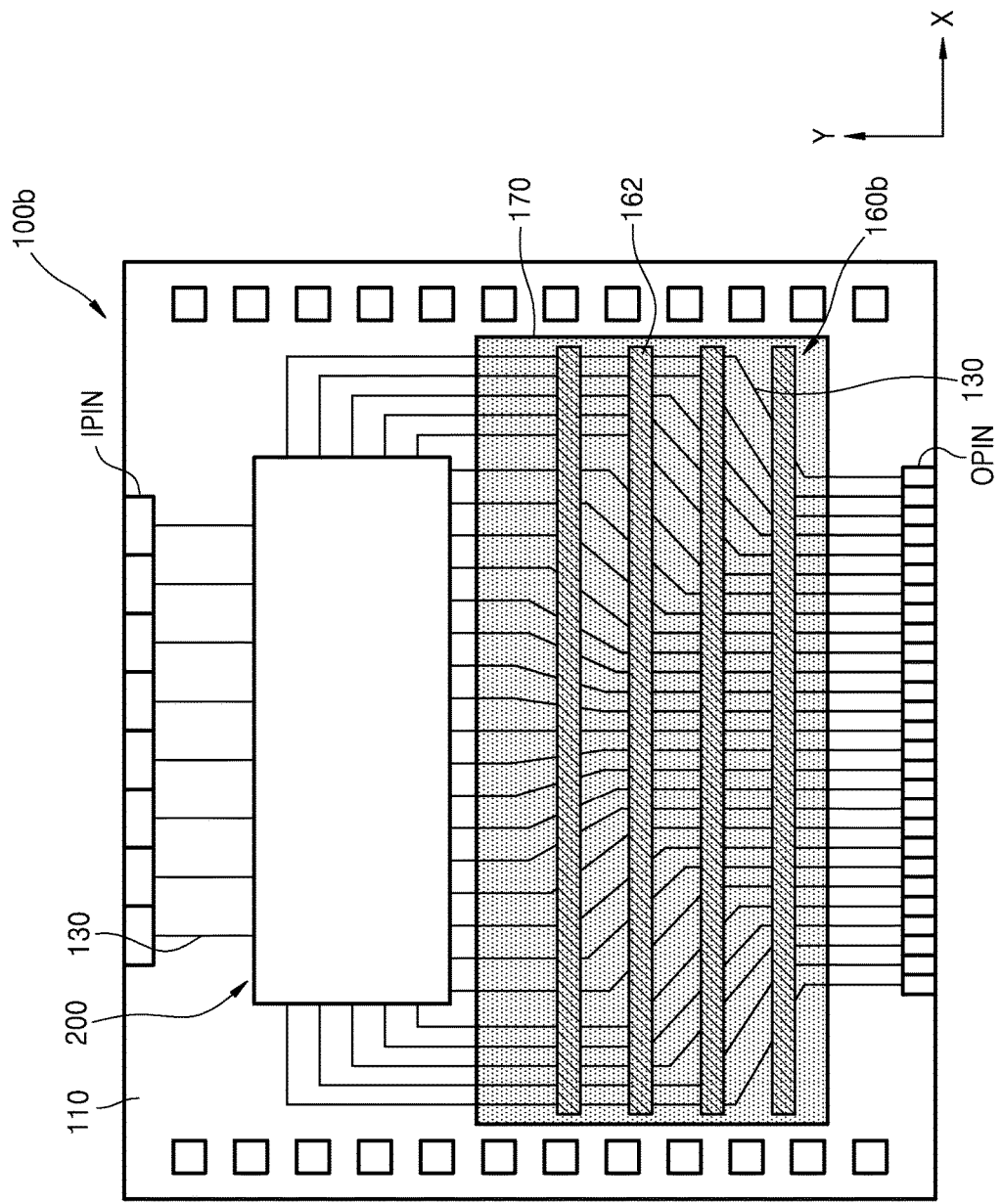
FIGS. 4A and 4B are respectively a schematic diagram and a cross-sectional view of a COF semiconductor package according to an exemplary embodiment.
Figure 4B:
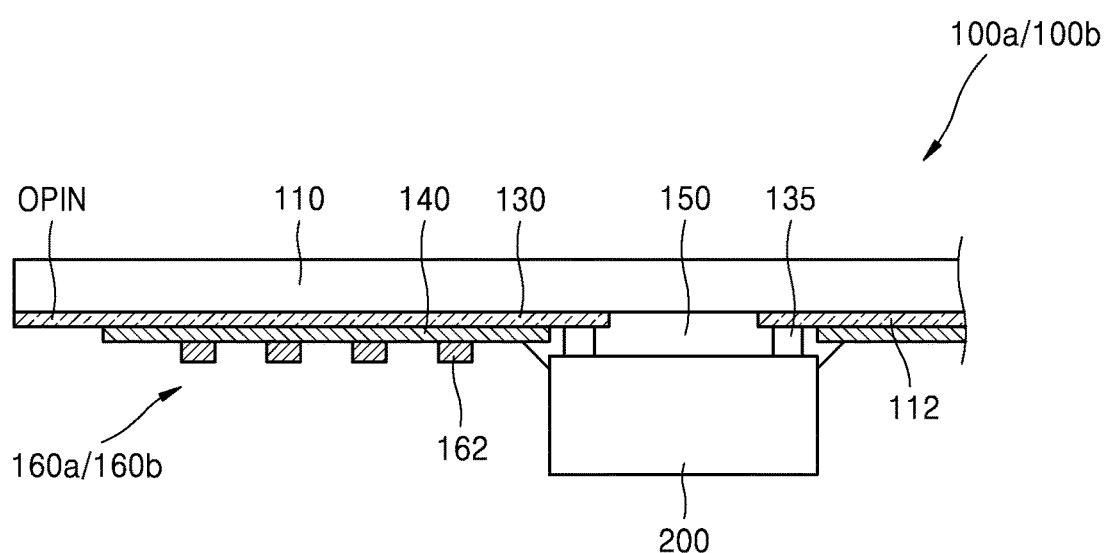
Figure 5B:
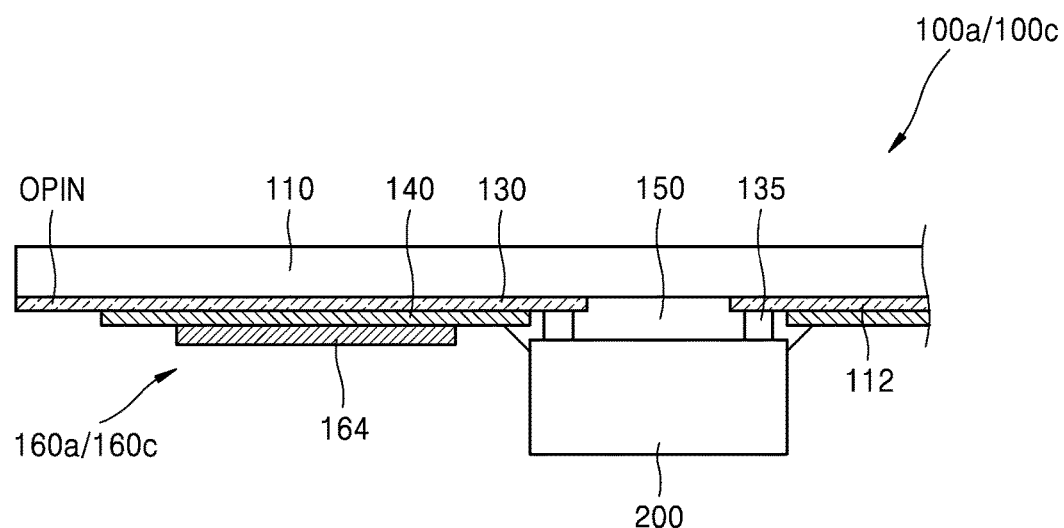

Cross-sectional views of the COF semiconductor package 100a are illustrated in FIGS. 4B and 5B.

The barrier dam 160a may prevent water or the liquid detergent from flowing to the anisotropic conductive layer (refer to 600 in FIG. 1A) located between the image display panel (refer to 500 in FIG. 1A) and the film substrate 110. Also, the permeation of water or the liquid detergent may be prevented by the hydrophobic coating layer 170 covering the barrier dam 160a.

FIGS. 4A to 4B are respectively a schematic diagram and a cross-sectional view of a COF semiconductor package 100b according to an exemplary embodiment. In FIGS. 4A and 4B, the same descriptions as in FIGS. 1A to 3 will be omitted.

Referring to FIG. 4A, the COF semiconductor package 100b may include a film substrate 110, a conductive interconnection 130, and a semiconductor chip 200. In some exemplary embodiments, the COF semiconductor package 100b may further include a hydrophobic coating layer 170.

The COF semiconductor package 100b may further include a barrier dam 160b. The barrier dam 160b may be formed on the film substrate 110 and located between the semiconductor chip 200 and an output pin OPIN.

The barrier dam 160b may include a plurality of first barrier dams 162. The plurality of first barrier dams 162 may be spaced apart from one another and extend in a first direction X.

The first barrier dams 162 may serve as barriers to prevent the flow of water or a liquid detergent from the side of the semiconductor chip 200 or an input pin IPIN to the side of the output pin OPIN. Also, a distance between adjacent ones of the plurality of first barrier dams 162 may be relatively small, and the flow of water or the liquid detergent from at least one side of the film substrate 110 may be inhibited by the hydrophobic coating layer 170 covering the barrier dam 160b.

Accordingly, the barrier dam 160b and/or the hydrophobic coating layer 170 may prevent water or the liquid detergent from flowing to the anisotropic conductive layer (refer to 600 in FIG. 1A) located between the image display panel (refer to 500 in FIG. 1A) and the film substrate 110.

Referring to FIG. 4B, the COF semiconductor package 100a/100b may further include the barrier dam 160a/160b. The barrier dam 160a/160b may be formed on a solder resist layer 140. FIG. 4B illustrates only the first barrier dams 162.

FIGS. 5A and 5B are respectively a schematic diagram and a cross-sectional view of a COF semiconductor package 100c according to an exemplary embodiment. In FIGS. 5A and 5B, the same descriptions as in FIGS. 1A to 4B will be omitted.

Referring to FIG. 5A, the COF semiconductor package 100c may include a film substrate 110, a conductive interconnection 130, and a semiconductor chip 200. In some exemplary embodiments, the COF semiconductor package 100c may further include a hydrophobic coating layer 170.

The COF semiconductor package 100c may further include a barrier dam 160c. The barrier dam 160c may be formed on the film substrate 110 and located between the semiconductor chip 200 and an output pin OPIN.

The barrier dam 160c may include a plurality of second barrier dams 164. The plurality of second barrier dams 164 may be spaced apart from one another and extend in a second direction Y.

The second barrier dams 164 may serve as barriers to prevent the flow of water or the liquid detergent from at least one side of the film substrate 110. Also, a distance between adjacent ones of the plurality of second barrier dams 164 may be relatively small, and the flow of water or a liquid detergent from a side of the semiconductor chip 200 or the input pin IPIN to a side of the output pin OPIN may be inhibited by the hydrophobic coating layer 170 covering the barrier dam 160c.

Accordingly, the barrier dam 160c and/or the hydrophobic coating layer 170 may prevent water or the liquid detergent from flowing to the anisotropic conductive layer (refer to 600 in FIG. 1A) located between the image display panel (refer to 500 in FIG. 1A) and the film substrate 110).

Referring to FIG. 5B, the COF semiconductor package 100a/100c may further include the barrier dam 160a/160c. The barrier dam 160a/160c may be formed on a solder resist layer 140. FIG. 5B illustrates only the second barrier dams 164.

Figure 6:
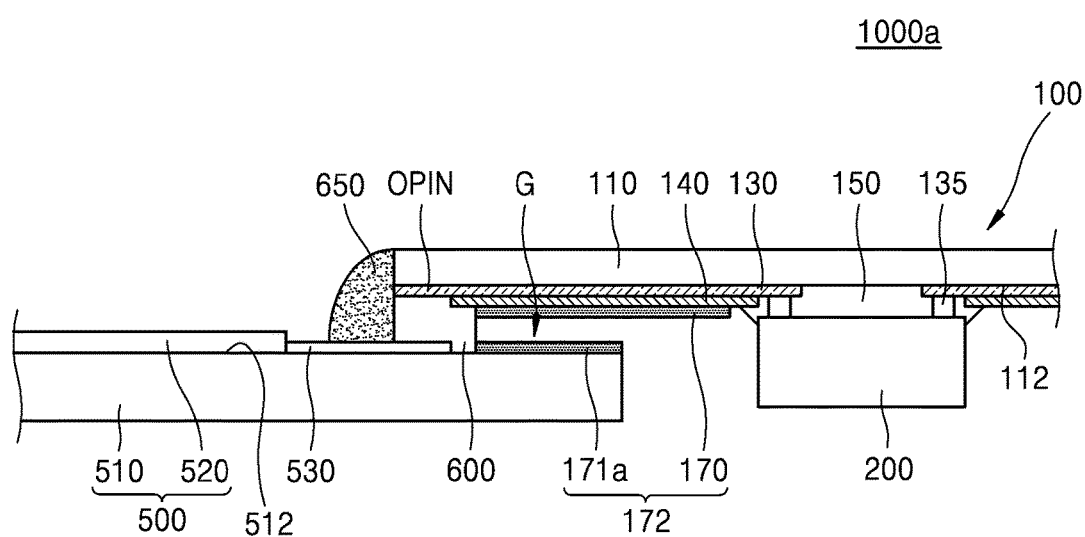
FIG. 6 is a cross-sectional view of a portion of a display apparatus including a COF semiconductor package according to an exemplary embodiment.

FIG. 6 is a cross-sectional view of a portion of a display apparatus 1000a including a COF semiconductor package according to an exemplary embodiment. In FIG. 6, the same descriptions as in FIGS. 1A to 2B will be omitted.

Referring to FIG. 6, the display apparatus 1000a may include a COF semiconductor package 100 and an image display panel 500.

The COF semiconductor package 100 may include a film substrate 110 and a semiconductor chip 200 adhered to a first surface 112 of the film substrate 110. The semiconductor chip 200 may be, for example, a display driver IC. An output pin OPIN may be formed at one edge of the film substrate 110. The output pin OPIN may be formed on the first surface 112 of the film substrate 110. The COF semiconductor package 100 may be the COF semiconductor package 100 shown in FIGS. 2A and 2B and thus, detailed descriptions thereof will be omitted.

The image display panel 500 may include a transparent substrate 510 and an image region 520 and a plurality of panel connection interconnections 530 formed on the transparent substrate 510. In some exemplary embodiments, the image region 520 and the plurality of panel connection interconnections 530 may be formed on a second surface 512 of the transparent substrate 510. A plurality of pixels included in the image region 520 may be connected to the plurality of panel connection interconnections 530.

A portion of one surface of the COF semiconductor package 100 may face a portion of one surface of the image display panel 500. Specifically, a portion of the first surface 112 of the film substrate 110 may face a portion of the second surface 512 of the transparent substrate 510. The output pin OPIN and portions of the panel connection interconnections 530 may be respectively formed on the portion of the first surface 112 of the film substrate 110 and the portion of the second surface 512 of the transparent substrate 510, which face each other.

An anisotropic conductive layer 600 may be located between the COF semiconductor package 100 and the image display panel 500. The anisotropic conductive layer 600 may be located between the portion of the first surface 112 of the film substrate 110 and the portion of the second surface 512 of the transparent substrate 510, which face each other. Specifically, the anisotropic conductive layer 600 may be located between the output pin OPIN of the COF semiconductor package 100 and the panel connection interconnections 530 of the image display panel 500. The output pin OPIN may be electrically connected to the panel connection interconnections 530 by the anisotropic conductive layer 600.

The anisotropic conductive layer 600 may not completely fill a space between the portion of the first surface 112 of the film substrate 110 and the portion of the second surface 512 of the transparent substrate 510, which face each other. Accordingly, a gap G in which the anisotropic conductive layer 600 is not located may be formed between the portion of the first surface 112 of the film substrate 110 and the portion of the second surface 512 of the transparent substrate 510, which face each other.

A hydrophobic coating layer 172 may cover a portion of the first surface 112 of the film substrate 110 of the COF semiconductor package 100 and a portion of the second surface 512 of the transparent substrate 510 of the image display panel 500. The hydrophobic coating layer 172 may include a first hydrophobic coating layer 170 formed on the portion of the first surface 112 of the film substrate 110 and a second hydrophobic coating layer 171a formed on the portion of the second surface 512 of the transparent substrate 510.

The first hydrophobic coating layer 170 may be formed on a solder resist layer 140 formed on the first surface 112 of the film substrate 110.

The hydrophobic coating layer 172 may completely cover the portion of the first surface 112 of the film substrate 110 and the portion of the second surface 512 of the transparent substrate 510 within the gap G. In some exemplary embodiments, the first hydrophobic coating layer 170 may cover the portion of the first surface 112 of the film substrate 110 within the gap G and also cover a portion of the second surface 512 of the transparent substrate 510 outside the gap G. Specifically, the first hydrophobic coating layer 170 may extend from a portion of the first surface 112 of the film substrate 110 adjacent to the gap G to a portion of the first surface 112 of the film substrate 110 within the gap G.

Each of the first hydrophobic coating layer 170 and the second hydrophobic coating layer 171a may be formed to such a thickness as to maintain the gap G. For example, when a distance between the portion of the first surface 112 of the film substrate 110 and the portion of the second surface 512 of the transparent substrate 510, which face each other, is about several tens of μm, each of the first hydrophobic coating layer 170 and the second hydrophobic coating layer 171a may have a thickness of about 1 μm. Accordingly, the first hydrophobic coating layer 170 and the second hydrophobic coating layer 171a may be spaced apart from each other to maintain the gap G. The width of the gap G may be equal to a value obtained by subtracting the thickness of each of the first hydrophobic coating layer 170 and the second hydrophobic coating layer 171a from the distance between the portion of the first surface 112 of the film substrate 110 and the portion of the second surface 512 of the transparent substrate 510, which face each other. For example, the gap G may range from several μm to several tens of μm. In an exemplary embodiment, a horizontal length of the gap G is about 10 μm-30 μm.

The first hydrophobic coating layer 170 and the second hydrophobic coating layer 171a may be separately formed on the COF semiconductor package 100 and the image display panel 500, respectively, before the COF semiconductor package 100 is connected to the image display panel 500 by the anisotropic conductive layer 600. The first hydrophobic coating layer 170 and the second hydrophobic coating layer 171a may be formed by using, for example, a stencil method or a spray method.

The hydrophobic coating layer 172 may prevent water or a liquid detergent from flowing from the outside of the gap G into the gap G. Specifically, although described below with reference to FIGS. 12 and 13, water or the liquid detergent may have a relatively large contact angle on the hydrophobic coating layer 172. Accordingly, when the hydrophobic coating layer 172 is formed in a portion (e.g., the gap G) having a relatively narrow width, since water or the liquid detergent has a large contact angle, the permeation of the water or liquid detergent into an opening of the gap G due to a capillary phenomenon or capillary action may be prevented. Accordingly, since water or a liquid detergent fails to permeate the anisotropic conductive layer 600 located in the gap G, occurrence of a short circuit or a circuit burn may be prevented between the output pin OPIN of the COF semiconductor package 100 and the panel connection interconnections 530 of the image display panel 500.

In an exemplary embodiment, the flow of a liquid into the gap G to be in contact with the anisotropic conductive layer 600 may be prevented by a width of the gap between the first and the second hydrophobic layers 170 and 171a. In another exemplary embodiment, the flow of a liquid into the gap G may be further prevented by a length of the gap G from at about the anisotropic conductive layer 600 to the opening of the gap, e.g., an opening between the first and the second hydrophobic layers 170 and 171a.

In addition, since the gap G serving as a vacant space is formed between the portion of the first surface 112 of the film substrate 110 and the portion of the second surface 512 of the transparent substrate 510, which face each other, electrical connection of the output pin OPIN with the panel connection interconnection 530 may be reliable in the display apparatus 1000a. For example, when the gap G is filled with a predetermined material, the display apparatus 1000a may have no vacant inner space, and the predetermined material filling the gap G may expand or contract due to heat generated during operations of the display apparatus 1000a so that the anisotropic conductive layer 600 may be deformed. Thus, a short circuit may occur between the output pin OPIN and the panel connection interconnection 530. However, in the display apparatus 1000a according to the present embodiment, the gap G serving as a vacant space may be formed between the portion of the first surface 112 of the film substrate 110 and the portion of the second surface 512 of the transparent substrate 510, which face each other. Accordingly, even if heat is generated during operations of the display apparatus 1000a, deformation of the anisotropic conductive layer 600 may be prevented. Therefore, electrical connection of the output pin OPIN with the panel connection interconnection 530 may be reliable.

Protective glue 650 may be formed on the image display panel 500 and cover side surfaces of the anisotropic conductive layer 600. The protective glue 650 may cover a side surface of the anisotropic conductive layer 600 and at least a portion of a side surface of the film substrate 110 on the second surface 512 of the transparent substrate 510. The protective glue 650 may cover a side surface of the anisotropic conductive layer 600 at a side opposite to the gap G.

The protective glue 650 may be, for example, tuffy glue. The protective glue 650 may include, for example, adhesive glue, such as UV curing glue or natural drying glue.

Figure 7:
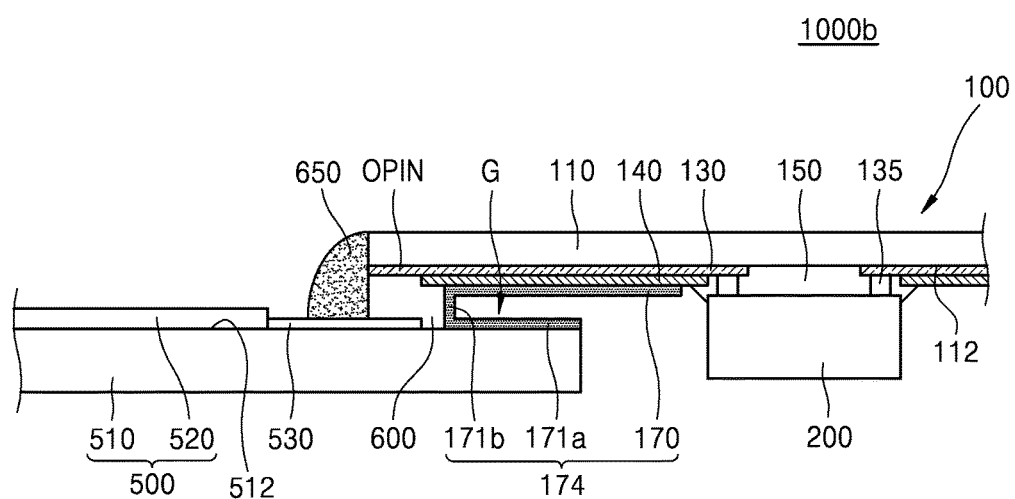
FIG. 7 is a cross-sectional view of a portion of a display apparatus including a COF semiconductor package according to an exemplary embodiment.

FIG. 7 is a cross-sectional view of a portion of a display apparatus 1000b including a COF semiconductor package according to an exemplary embodiment. In FIG. 7, the same descriptions as in FIG. 6 will be omitted.

Referring to FIG. 7, the display apparatus 1000b may include a COF semiconductor package 100 and an image display panel 500. The COF semiconductor package 100 may be the COF semiconductor package 100 shown in FIGS. 2A and 2B and thus, detailed descriptions thereof will be omitted.

A hydrophobic coating layer 174 may cover a portion of a first surface 112 of a film substrate 110 of the COF semiconductor package 100, a portion of a second surface 512 of a transparent substrate 510 of an image display panel 500, and a surface of an anisotropic conductive layer 600. The hydrophobic coating layer 174 may include a first hydrophobic coating layer 170 located on the portion of the first surface 112 of the film substrate 110, a second hydrophobic coating layer 171a located on the portion of the second surface 512 of the transparent substrate 510, and the surface of the anisotropic conductive layer 600.

The hydrophobic coating layer 174 may cover the portion of the first surface 112 of the film substrate 110, the portion of the second surface 512 of the transparent substrate 510, and the surface of the anisotropic conductive layer 600 within the gap G.

The first hydrophobic coating layer 170, the second hydrophobic coating layer 171a, and the third hydrophobic coating layer 171b may be united with one another into the hydrophobic coating layer 174 after the COF semiconductor package 100 and the image display panel 500 are connected to each other by the anisotropic conductive layer 600. Accordingly, the third hydrophobic coating layer 171b may be connected to each of the first hydrophobic coating layer 170 and the second hydrophobic coating layer 171a. The hydrophobic coating layer 174 including the first hydrophobic coating layer 170, the second hydrophobic coating layer 171a, and the third hydrophobic coating layer 171b may be formed by using, for example, a dipping method or a spray method.

The hydrophobic coating layer 174 may prevent water or a liquid from flowing from the outside of the gap G into the gap G. Also, even if water or the liquid detergent partially permeates the gap G, the third hydrophobic coating layer 171b may prevent water or the liquid detergent from permeating the anisotropic conductive layer 600. Thus, occurrence of a short circuit or a circuit burn may be prevented between the output pin OPIN of the COF semiconductor package 100 and the panel connection interconnections 530 of the image display panel 500.

Figure 8:
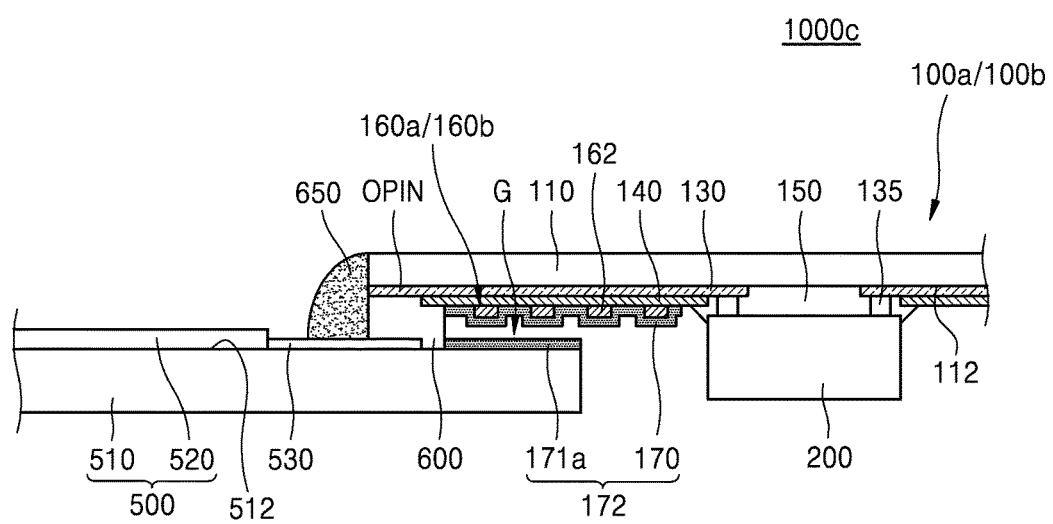
FIG. 8 is a cross-sectional view of a portion of a display apparatus including a COF semiconductor package according to an exemplary embodiment.

FIG. 8 is a cross-sectional view of a portion of a display apparatus 1000c including a COF semiconductor package according to an exemplary embodiment. In FIG. 8, the same descriptions as in FIGS. 1A, 1B, 3 to 4B, and 6 will be omitted.

Referring to FIG. 8, the display apparatus 1000c may include a COF semiconductor package 100a/100b and an image display panel 500. The COF semiconductor package 100a/100b may further include a barrier dam 160a/160b. The barrier dam 160a/160b may be located between a film substrate 110 and a first hydrophobic coating layer 170. That is, the first hydrophobic coating layer 170 may cover the barrier dam 160a/160b formed on the film substrate 110. Alternatively, the barrier dam 160a/160b may be located between a solder resist layer 140 and the first hydrophobic coating layer 170.

The COF semiconductor package 100a/100b may be the COF semiconductor package 100a shown in FIG. 3 or the COF semiconductor package 100b shown in FIG. 4A and thus, descriptions thereof will be omitted. FIG. 8 illustrates only a first barrier dam 162. That is, when the COF semiconductor package 100a/100b is the COF semiconductor package 100a shown in FIG. 3, the barrier dam 160a may include a plurality of first barrier dams 162 and a plurality of second barrier dams (refer to 164 in FIG. 3). When the COF semiconductor package 100a/100b is the COF semiconductor package 100b shown in FIG. 4A, the barrier dam 160b may include a plurality of first barrier dams 162.

The first barrier dams 162 may serve as barriers to prevent the flow of water or a liquid detergent from the side of a semiconductor chip 200 to the side of an output pin OPIN. Also, a distance between adjacent ones of the plurality of first barrier dams 162 may be relatively small, and the flow of water or the liquid detergent from at least one side of the film substrate 110 may be inhibited by the first hydrophobic coating layer 170 covering the barrier dam 160a/160b.

An anisotropic conductive layer 600 may be located between the COF semiconductor package 100a/100b and the image display panel 500. A gap G in which the anisotropic conductive layer 600 is not located may be formed between a portion of a first surface 112 of the film substrate 110 and a portion of a second surface 512 of the transparent substrate 510, which may face each other. In some exemplary embodiments, at least a portion of the barrier dam 160a/160b may be located in the gap G. For example, some of the plurality of first barrier dams 162 may be located on the first surface 112 of the film substrate 110 adjacent to the gap G, while the remaining ones thereof may be located on the first surface 112 of the film substrate 110 in the gap G.

Each of the barrier dam 160a/160b, the first hydrophobic coating layer 170, and the second hydrophobic coating layer 171a may be formed to such a thickness as to maintain the gap G.

For example, when a distance between the portion of the first surface 112 of the film substrate 110 and the portion of the second surface 512 of the transparent substrate 512, which face each other, is several tens of μm, each of the first hydrophobic coating layer 170 and the second hydrophobic coating layer 171a may have a thickness of about 1 μm, and the barrier dam 160a/160b may have a thickness of several μm. Accordingly, the first hydrophobic coating layer 170 and the second hydrophobic coating layer 171a may be spaced apart from each other to maintain the gap G. In particular, a portion of the first hydrophobic coating layer 170 formed on the barrier dam 160a/160b may be spaced apart from the second hydrophobic coating layer 171a.

The first hydrophobic coating layer 170 and the second hydrophobic coating layer 171a may be separately formed on the COF semiconductor package 100 and the image display panel 500, respectively, before the COF semiconductor package 100 is connected to the image display panel 500 by the anisotropic conductive layer 600.

A hydrophobic coating layer 172 may prevent water or a liquid detergent from flowing from the outside of the gap G into the gap G. Also, since some of the plurality of first barrier dams 162 are located on the first surface 112 of the film substrate 110 in the gap G, the gap G may be relatively narrowed. Accordingly, movement of water or a liquid detergent toward the anisotropic conductive layer 600 may be further precluded in the gap G. Accordingly, since water or the liquid detergent fails to permeate the anisotropic conductive layer 600 located in the gap G, occurrence of a short circuit or a circuit burn may be prevented between the output pin OPIN of the COF semiconductor package 100a/100b and the panel connection interconnections 530 of the image display panel 500.

Figure 9:
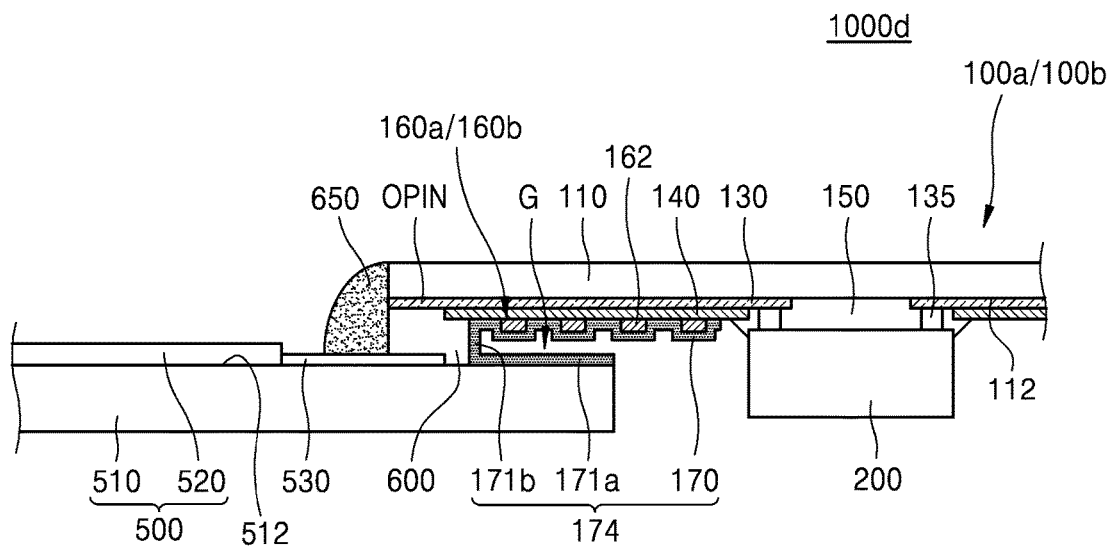
FIG. 9 is a cross-sectional view of a portion of a display apparatus including a COF semiconductor package according to an exemplary embodiment.

FIG. 9 is a cross-sectional view of a portion of a display apparatus 1000d including a COF semiconductor package according to an exemplary embodiment. In FIG. 9, the same descriptions as in FIG. 8 will be omitted.

Referring to FIG. 9, the display apparatus 1000d may include a COF semiconductor package 100 and an image display panel 500. The COF semiconductor package 100a/100b may be the COF semiconductor package 100a shown in FIG. 3 or the COF semiconductor package 100b shown in FIG. 4A and thus, detailed descriptions thereof will be omitted.

A hydrophobic coating layer 174 may cover a portion of a first surface 112 of a film substrate 110 of the COF semiconductor package 100a/100b, a portion of a second surface 512 of a transparent substrate 510 of the image display panel 500, and a surface of an anisotropic conductive layer 600. The hydrophobic coating layer 174 may include a first hydrophobic coating layer 170 located on the portion of the first surface 112 of the film substrate 110, a second hydrophobic coating layer 171a located on the portion of the second surface 512 of the transparent substrate 510, and a third hydrophobic coating layer 171b covering the surface of the anisotropic conductive layer 600.

The hydrophobic coating layer 174 may cover the portion of the first surface 112 of the film substrate 110, the portion of the second surface 512 of the transparent substrate 510, and the surface of the anisotropic conductive layer 600 within the gap G.

The first hydrophobic coating layer 170, the second hydrophobic coating layer 171a, and the third hydrophobic coating layer 171b may be united with one another into the hydrophobic coating layer 174 after the COF semiconductor package 100a/100b is connected to the image display panel 500 by using the anisotropic conductive layer 600. Accordingly, the third hydrophobic coating layer 171b) may be connected to each of the first hydrophobic coating layer 170 and the second hydrophobic coating layer 171a. The hydrophobic coating layer 174 including the first hydrophobic coating layer 170, the second hydrophobic coating layer 171a, and the third hydrophobic coating layer 171b may be formed by using, for example, a dipping method or a spray method.

The hydrophobic coating layer 174 may prevent water or a liquid detergent from flowing from the outside of the gap G into the gap G. Also, even if water or the liquid detergent partially permeates the gap G, the third hydrophobic coating layer 171b may prevent water or the liquid detergent from permeating the anisotropic conductive layer 600. Thus, occurrence of a short circuit or a circuit burnt may be prevented between the output pin OPIN of the COF semiconductor package 100a/100b and the panel connection interconnections 530 of the image display panel 500.

Figure 10:
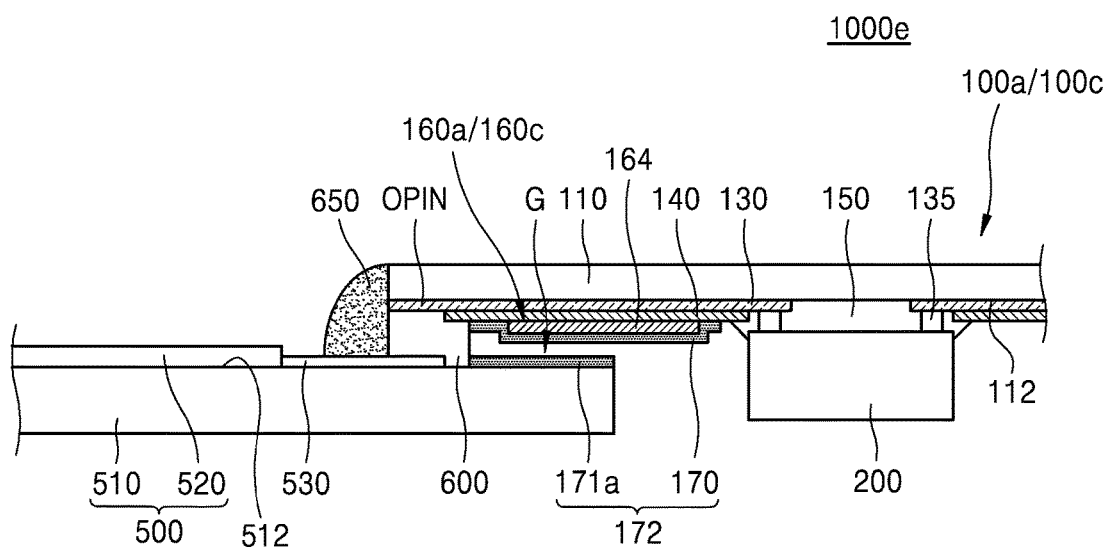
FIG. 10 is a cross-sectional view of a portion of a display apparatus including a COF semiconductor package according to an exemplary embodiment.

FIG. 10 is a cross-sectional view of a portion of a display apparatus 1000e including a COF semiconductor package according to an exemplary embodiment. In FIG. 10, the same descriptions as in FIGS. 1A, 1B, 3, and 5A to 6 will be omitted.

Referring to FIG. 10, the display apparatus 1000e may include a COF semiconductor package 100a/100c and an image display panel 500. The COF semiconductor package 100a/100c may further include a barrier dam 160a/160c. The barrier dam 160a/160c may be located between a film substrate 110 and a first hydrophobic coating layer 170. That is, the first hydrophobic coating layer 170 may cover the barrier dam 160a/160c located on the film substrate 110. Alternatively, the barrier dam 160a/160c may be located between a solder resist layer 140 and the first hydrophobic coating layer 170.

The COF semiconductor package 100a/100c may be the COF semiconductor package 100a shown in FIG. 3 or the COF semiconductor package 100c shown in FIG. 5A and thus, detailed descriptions thereof will be omitted. FIG. 10 illustrates only a second barrier dam 164. That is, when the COF semiconductor package 100a/100c is the COF semiconductor package 100a shown in FIG. 3, the barrier dam 160a may include a plurality of first barrier dams (refer to 162 in FIG. 3) and a plurality of second barrier dams 164. When the COF semiconductor package 100a/100c is the COF semiconductor package 100c shown in FIG. 5A, the barrier dam 160c may include a plurality of second barrier dams 164.

The second barrier dam 164 may serve as a barrier to prevent water or a liquid detergent from flowing from at least one side of the film substrate 110. Also, a distance between adjacent ones of the plurality of second barrier dams 164 may be relatively small, and the flow of water or the liquid detergent from a side of the semiconductor chip 200 to a side of the output pin OPIN may be inhibited by the first hydrophobic coating layer 170 covering the barrier dam 160a/160c.

The anisotropic conductive layer 600 may be located between the COF semiconductor package 100a/100c and the image display panel 500. A gap G in which the anisotropic conductive layer 600 is not located may be formed between the portion of the first surface 112 of the film substrate 110 and the portion of the second surface 512 of the transparent substrate 510, which face each other. In some exemplary embodiments, at least a portion of the barrier dam 160a/160c may be located in the gap G. For example, a portion of each of the plurality of second barrier dams 164 may be located on the first surface 112 of the film substrate 110 adjacent to the gap G, while the remaining portion of each of the plurality of second barrier dams 164 may be located on the first surface 112 of the film substrate 110 in the gap G. That is, each of the plurality of second barrier dams 164 may extend from the outside of the gap G into the gap G.

Each of the barrier dam 160a/160c, the first hydrophobic coating layer 170, and the second hydrophobic coating layer 171a may be formed to such a thickness as to maintain the gap G.

For example, when a distance between the portion of the first surface 112 of the film substrate 110 and the portion of the second surface 512 of the transparent substrate 510, which face each other, is several tens of μm, each of the first hydrophobic coating layer 170 and the second hydrophobic coating layer 171a may have a thickness of about 1 μm, and the barrier dam 160a/160c may have a thickness of about several μm. Accordingly, the first hydrophobic coating layer 170 and the second hydrophobic coating layer 171a may be spaced apart from each other to maintain the gap G. In particular, a portion of the first hydrophobic coating layer 170 formed on the barrier dam 160a/160c may be spaced apart from the second hydrophobic coating layer 171a.

The first hydrophobic coating layer 170 and the second hydrophobic coating layer 171a may be separately formed on the COF semiconductor package 100a/100c and the image display panel 500, respectively, before the COF semiconductor package 100a/100c is connected to the image display panel 500 by the anisotropic conductive layer 600.

The hydrophobic coating layer 172 may prevent water or a liquid detergent from flowing from the outside of the gap into the gap G. Also, since portions of the second barrier dams 164 are located on the first surface 112 of the film substrate 110 in the gap G, the gap G may be relatively narrowed. Accordingly, the movement of water or a liquid detergent toward the anisotropic conductive layer 600 may be further precluded in the gap G. Accordingly, since water or the liquid detergent fails to permeate the anisotropic conductive layer 600 located in the gap G, occurrence of a short circuit or a circuit burn may be prevented between the output pin OPIN of the COF semiconductor package 100a/100c and the panel connection interconnections 530 of the image display panel 500.

Figure 11:
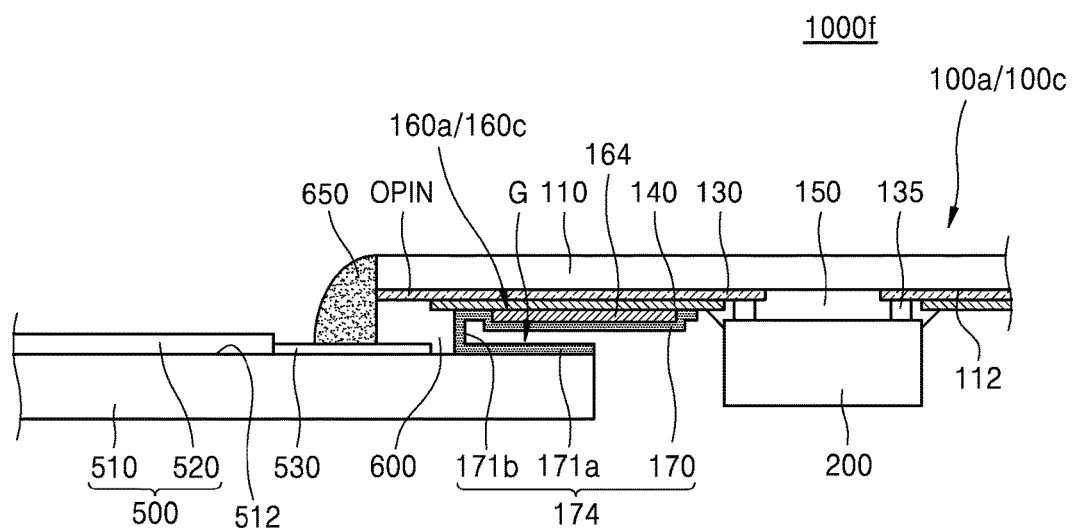
FIG. 11 is a cross-sectional view of a portion of a display apparatus including a COF semiconductor package according to an exemplary embodiment.

FIG. 11 is a cross-sectional view of a portion of a display apparatus 1000f including a COF semiconductor package according to an exemplary embodiment. In FIG. 11, the same descriptions as in FIG. 10 will be omitted.

Referring to FIG. 11, the display apparatus 1000f may include a COF semiconductor package 100 and an image display panel 500. The COF semiconductor package 100a/100c may be the COF semiconductor package 100a shown in FIG. 3 or the COF semiconductor package 100c shown in FIGS. 5A and 5C and thus, detailed descriptions thereof will be omitted.

A hydrophobic coating layer 174 may cover a portion of a first surface 112 of a film substrate 110 of a COF semiconductor package 100a/100c, a portion of a second surface 512 of a transparent substrate 510 of an image display panel 500, and a surface of an anisotropic conductive layer 600. The hydrophobic coating layer 174 may include a first hydrophobic coating layer 170 located on the portion of the first surface 112 of the film substrate 110, a second hydrophobic coating layer 171a located on the portion of the second surface 512 of the transparent substrate 510, and a third hydrophobic coating layer 171b covering the surface of the anisotropic conductive layer 600.

The hydrophobic coating layer 174 may cover the portion of the first surface 112 of the film substrate 110, the portion of the second surface 512 of the transparent substrate 510, and the surface of the anisotropic conductive layer 600 within the gap G.

The first hydrophobic coating layer 170, the second hydrophobic coating layer 171a, and the third hydrophobic coating layer 171b may be united with one another into the hydrophobic coating layer 174 after the COF semiconductor package 100a/100c is connected to the image display panel 500 by using the anisotropic conductive layer 600. Accordingly, the third hydrophobic coating layer 171b may be connected to each of the first hydrophobic coating layer 170 and the second hydrophobic coating layer 171a. The hydrophobic coating layer 174 including the first hydrophobic coating layer 170, the second hydrophobic coating layer 171a, and the third hydrophobic coating layer 171b may be formed by using, for example, a dipping method or a spray method.

The hydrophobic coating layer 174 may prevent water or a liquid detergent from flowing from the outside of the gap G into the gap G. Also, even if water or the liquid detergent partially permeates the gap G, the third hydrophobic coating layer 171b may prevent water or the liquid detergent from permeating the anisotropic conductive layer 600. Thus, occurrence of a short circuit or a circuit burn may be prevented between the output pin OPIN of the COF semiconductor package 100a/100c and the panel connection interconnections 530 of the image display panel 500.

Figure 12:
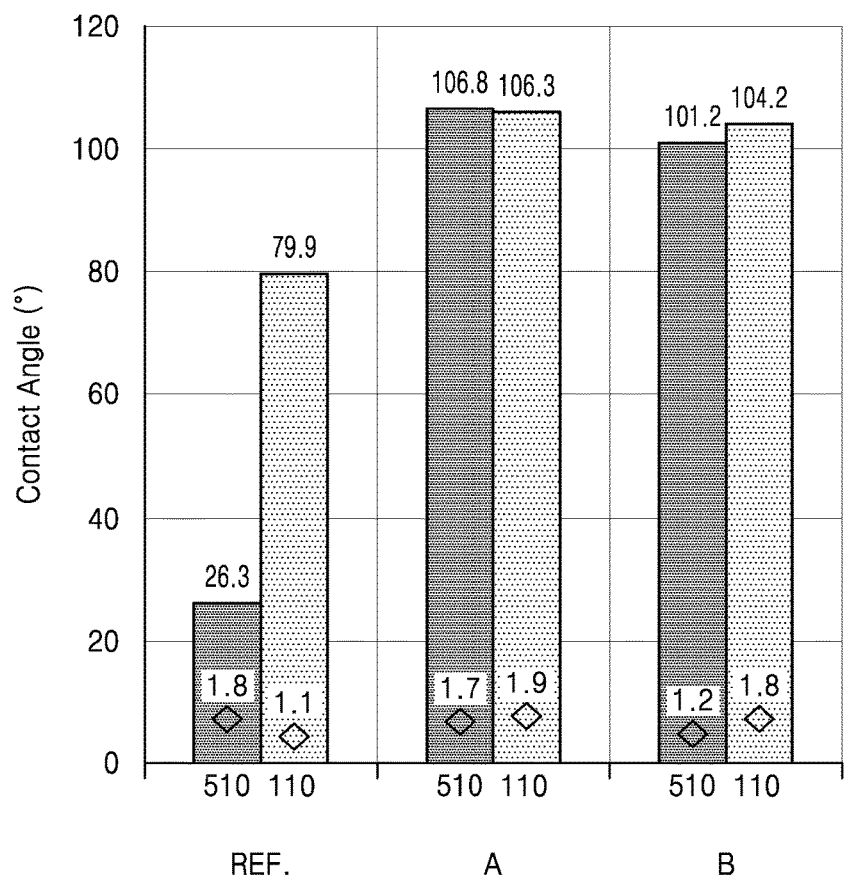
FIG. 12 is a graph showing contact angles of liquids on surfaces of display apparatuses including COF semiconductor packages according to Comparative example and embodiments.
Figure 13:
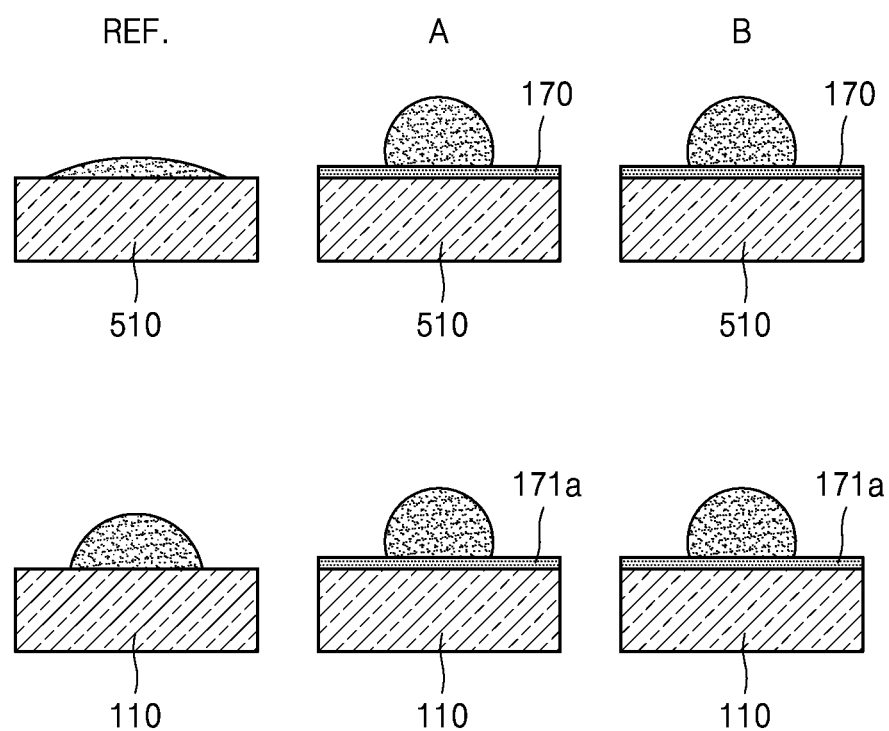
FIG. 13 is a diagram showing shapes of the liquids on the surfaces of the display apparatuses including the COF semiconductor packages shown in FIG. 12.

FIG. 12 is a graph showing contact angles of liquids on a surface of a display apparatus including a COF semiconductor package according to Comparative example and exemplary embodiments, and FIG. 13 is a diagram showing shapes of the liquids.

Referring to FIGS. 12 and 13, Comparative example REF shows contact angles of liquids on the film substrate 110 and the transparent substrate 510 on which the first and second hydrophobic coating layers 170 and 171a described with reference to FIGS. 1 to 11 were not formed.

First embodiment A shows contact angles of liquids on the film substrate 110 and the transparent substrate 510 on which the first and second hydrophobic coating layers 170 and 171a described with reference to FIGS. 1 to 11 were respectively formed. Second embodiment B shows contact angles of liquids on the film substrate 110 and the transparent substrate 510 on which the first and second hydrophobic coating layers 170 and 171a described with reference to FIGS. 1 to 11 were respectively formed and an annealing process was performed at a temperature of about 150° C. for about 30 minutes. For reference, a lozenge-shaped symbol ◇ denotes a standard deviation in each example. In an exemplary embodiment, the first and the second hydrophobic coating layers 170 and 171a each provide for a contact angle with liquids that is greater than 80°. In another exemplary embodiment, the contact angle that is greater than 100° is provided by the first and the second hydrophobic coating layers 170 and 171a.

In Comparative example REF, contact angles of liquids on the film substrate 110 and the transparent substrate 510 were 26.3° and 79.9°, respectively. In contrast, in First embodiment A, it can be seen that contact angles of liquids on the film substrate 110 and the transparent substrate 510 on which the first hydrophobic coating layer 170 and the second hydrophobic coating layer 171a were respectively formed greatly increased to 106.8° and 106.3°, respectively. In Second example B, it can be seen that contact angles of liquids on the film substrate 110 and the transparent substrate 510 on which the first hydrophobic coating layer 170 and the second hydrophobic coating layer 171a were respectively formed were 101.2° and 104.2°, which were not very different than in First example A.

Accordingly, when the first and second hydrophobic coating layers 170 and 171a described with reference to FIGS. 1 to 11 are formed on the film substrate 110 and the transparent substrate 510, since water or a liquid detergent has a relatively large contact angle, the water or liquid detergent may fail to permeate a relatively narrow portion, such as the gap G (refer to FIGS. 6 to 11). Also, after the first and second hydrophobic coating layers 170 and 171a described with reference to FIGS. 1 to 11 are formed on the film substrate 110 and the transparent substrate 510, even if an annealing process is performed or even if heat is generated during operations of the display apparatus (refer to 1000a to 1000f in FIGS. 6 to 11), contact angles of liquids may not greatly vary. Thus, the permeation or flow of water or a liquid detergent into the gap G may be continuously prevented.

As is traditional in the field of the inventive concepts, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the inventive concepts. Further, the blocks, units and/or modules of the embodiments may be physically combined into more complex blocks, units and/or modules without departing from the scope of the inventive concepts.

While the inventive concept has been particularly shown and described with reference to exemplary embodiments thereof, it will be understood that various changes in form and details may be made therein without departing from the spirit and scope of the following claims.

What is claimed is:
1. A display apparatus comprising:
a chip-on-film semiconductor package comprising:
   a film substrate;
   a display driver integrated circuit disposed on the film substrate;
   a drive interconnection layer on the film substrate, the drive interconnection layer being electrically connected with the display driver integrated circuit;
   a solder resist layer on the drive interconnection layer; and
   a first hydrophobic coating layer on the solder resist layer;
an image display panel comprising:
   a transparent substrate;
   an image region on the transparent substrate;
   a panel interconnection layer on the transparent substrate, the panel interconnection layer being electrically connected with the image region; and
   a second hydrophobic coating layer on the transparent substrate; and
an anisotropic conductive layer electrically connecting the drive interconnection layer and the panel interconnection layer,
   wherein the first hydrophobic coating layer is located between the display driver integrated circuit and the anisotropic conductive layer.

2. The display apparatus of claim 1, wherein a third hydrophobic coating layer covers a side surface of the anisotropic conductive layer, and is connected to the first hydrophobic coating layer and the second hydrophobic coating layer respectively.

3. The display apparatus of claim 1, wherein the first hydrophobic coating layer and the second hydrophobic coating layer are spaced apart by a first gap.

4. The display apparatus of claim 3, wherein at least a portion of the first hydrophobic coating layer extends horizontally outside the first gap to a direction where the display driver integrated circuit is disposed.

5. The display apparatus of claim 1, further including a plurality of first barrier dams between the solder resist layer and the first hydrophobic coating layer, each of the plurality of first barrier dams extends along a direction intersecting the drive interconnection layer.

6. The display apparatus of claim 5, further including a plurality of second barrier dams between the solder resist layer and the first hydrophobic coating layer, each of the plurality of second barrier dams extends along a direction intersecting the first barrier dams.

7. The display apparatus of claim 6, wherein at least a portion of the first barrier dams and the second barrier dams are located within the first gap.

8. The display apparatus of claim 1, further comprising a glue located on the transparent substrate, the glue covering a side surface of the anisotropic conductive layer at a side opposite to the gap.

9. The display apparatus of claim 1, wherein the chip-on-film semiconductor package further includes an input pin electrically connecting the drive interconnection layer and the display driver integrated circuit.

10. The display apparatus of claim 1, wherein the chip-on-film semiconductor package further includes an output pin electrically connecting the drive interconnection layer and the anisotropic conductive layer.

11. The display apparatus of claim 1, wherein an under-fill layer is formed between the display driver integrated circuit and the film substrate, and surrounds a connection terminal connecting the display driver integrated circuit and the drive interconnection layer.

12. The display apparatus of claim 1, wherein each of the first to third hydrophobic coating layer includes one of fluoropolymer silage, fluorinated acrylate, and fluorinated acrylate hybrid.

13. The display apparatus of claim 1, wherein each of the first to third hydrophobic coating layer includes at least one of silicone resin, epoxy resin, styrene resin, phenol resin, and urethane resin.

14. The display apparatus of claim 1, wherein the hydrophobic coating layer has a thickness of about 1 µm.

15. A chip-on-film semiconductor package comprising:
a film substrate;
a display driver integrated circuit disposed on the film substrate;

a drive interconnection layer on the film substrate, the drive interconnection layer being electrically connected with the display driver integrated circuit;

a solder resist layer on the drive interconnection layer; and a first hydrophobic coating layer on the solder resist layer.

16. The chip-on-film semiconductor package of claim 15, wherein further including a barrier dam, the barrier dam comprises a plurality of first barrier dams that are disposed from one side of the film substrate toward another side of the film substrate.

17. The chip-on-film semiconductor package of claim 16, wherein the barrier dam further comprises a plurality of second barrier dams that intersect the plurality of first barrier dams and are disposed in a direction substantially perpendicular to the plurality of first barrier dams, wherein each of the plurality of second barrier dams are spaced apart from one another.

18. The chip-on-film semiconductor package of claim 17, wherein each of the plurality of first barrier dams and each of the plurality of second barrier dams substantially have an equal thickness.

19. The chip-on-film semiconductor package of claim 15, wherein the barrier dam is located between the solder resist layer and the hydrophobic coating layer.

20. The chip-on-film semiconductor package of claim 15, wherein the hydrophobic coating layer has a thickness of about 1 µm.

\* \* \* \* \*